United States Patent
Endo et al.

(10) Patent No.: US 7,297,968 B2
(45) Date of Patent: Nov. 20, 2007

(54) DEBRIS COLLECTOR FOR EUV LIGHT GENERATOR

(75) Inventors: Akira Endo, Kanagawa (JP); Hideo Hoshino, Kanagawa (JP)

(73) Assignee: Gigaphoton, Inc., Tokyo (JP)

( * ) Notice: Subject to any disclaimer, the term of this patent is extended or adjusted under 35 U.S.C. 154(b) by 257 days.

(21) Appl. No.: 10/554,430

(22) PCT Filed: Apr. 22, 2004

(86) PCT No.: PCT/JP2004/005815

§ 371 (c)(1),
(2), (4) Date: Oct. 24, 2005

(87) PCT Pub. No.: WO2004/095895

PCT Pub. Date: Nov. 4, 2004

(65) Prior Publication Data

US 2006/0249698 A1    Nov. 9, 2006

(30) Foreign Application Priority Data

Apr. 24, 2003  (JP) .............................. 2003-119756

(51) Int. Cl.
*H05G 2/00*    (2006.01)

(52) U.S. Cl. .................................. 250/504 R

(58) Field of Classification Search ...................... None
See application file for complete search history.

(56) References Cited

U.S. PATENT DOCUMENTS

| | | | |
|---|---|---|---|
| 6,973,164 B2 * | 12/2005 | Hartlove et al. | 378/119 |
| 6,987,279 B2 * | 1/2006 | Hoshino et al. | 250/504 R |
| 7,067,832 B2 * | 6/2006 | Mizoguchi et al. | 250/504 R |
| 2002/0094063 A1 * | 7/2002 | Nishimura et al. | 378/119 |

FOREIGN PATENT DOCUMENTS

| | | |
|---|---|---|
| JP | 8-37096 A | 2/1996 |
| JP | 8-162287 A | 6/1996 |
| JP | 2000-349009 | 12/2000 |
| JP | 2002-214400 A | 7/2002 |
| JP | 2002-289397 | 10/2002 |

* cited by examiner

*Primary Examiner*—Jack I. Berman
(74) *Attorney, Agent, or Firm*—Welsh & Katz, Ltd.

(57) ABSTRACT

A debris collector for EUV light generators is disclosed which enables to improve durabilities of optical units in a chamber including a collector mirror, to keep the vacuum degree in the chamber, and to suppress decrease in EUV light output by efficiently collecting debris bumping into the collector mirror at high speed from a target transformed into a plasma or debris adhering the collector mirror. A laser light irradiator (10) is so arranged that the irradiation direction of a laser light (L) is opposite to the traveling direction of a target (1). A debris collector (30) for collecting debris (3) is arranged in the travel path of the target (1).

16 Claims, 11 Drawing Sheets

CROSS-SECTIONAL VIEW

CROSS-SECTIONAL VIEW ALONG LINE A-A

DEBRIS COLLECTOR FOR EUV LIGHT GENERATOR

TECHNICAL FIELD

The present invention relates to an extreme ultraviolet (EUV) light generator used as a light source in equipment such as aligners, and more particularly to a device for collecting debris that forms when EUV light is generated.

BACKGROUND ART

Photolithographic technology for optically transferring circuit patterns to semiconductor wafers is vital to the integration of LSI chips. The aligners used in photolithography are primarily reduction and projection exposure systems known as steppers. That is, the light that passes through a reticle pattern irradiated with a source of illumination is projected by means of reduction and exposure optics onto a photosensitive substance present on a semiconductor substrate, thereby forming a circuit pattern. The resolution of the projected image is limited by the wavelength of the light source used. Accordingly, the desire for even finer pattern linewidths has led to the use of light sources of increasingly shorter wavelengths in the ultraviolet region.

Lately, KrF excimer lasers (wavelength, 248 nm) and ArF excimer lasers (wavelength, 193 nm) are being used as light sources to generate light in the deep ultraviolet region (DUV light), and F2 lasers (wavelength, 157 nm) are being used as light sources to generate light in the vacuum ultraviolet region (VUV light).

Efforts are currently underway to use EUV light sources (wavelength, 13.5 nm) which output light in the extreme ultraviolet region (EUV light) in order to carry out fabrication to an even smaller pattern linewidth.

One type of system for generating EUV light is the laser produced plasma (LPP) system. In a LPP-based EUV light source, a short-pulse laser beam is directed at a target, exciting the target to a plasma state and causing EUV light to be generated. This light is then collected with a collection lens, and the EUV light is output to the exterior.

FIG. 11 is a schematic showing the configuration of an EUV light generator which can be used as the light source for an aligner.

A collector mirror 41 which collects EUV light is provided at the interior of the chamber 4. The EUV light collected by the collector mirror 41 is sent to illumination optics (not shown) outside of the chamber 4, where the EUV light is used to form a semiconductor circuit pattern on a semiconductor wafer.

The interior of the chamber 4 is evacuated using a vacuum pump or other suitable means, thereby placing it in a vacuum state. This is done because EUV light has a short wavelength of 13.5 nm and will not propagate efficiently except in a vacuum.

A liquid target 1 which is an EUV light generating substance is released as a droplet from the nozzle 40. The target 1 may be, for example, liquid xenon (Xe). The target 1 has a diameter of about 10 μm.

The laser oscillator 10, which may be a YAG laser, for example, pulse generates a near-infrared laser beam L which irradiates a target 1. The direction of irradiation by the laser beam L is perpendicular to the direction in which the target 1 travels.

When the laser beam L irradiates the target 1, the target 1 is excited to a plasma 2 state and generates EUV light. The plasma that forms has a diameter in a range of about several tens of microns to 1 mm. The generated EUV light spreads out in all directions from the plasma 2 as the center. Because the collector mirror 41 is arranged so as to encircle the plasma 2, the EUV light which spreads out in all direction is collected by the collector mirror 41, which reflects the collected EUV light and sends it to illumination optics.

A portion of the target 1 fragments and scatters under the influence of shock waves during plasma generation, forming debris 3. The debris 3 includes high-speed ions and residues that were not transformed to plasma.

A collecting tube 130 is provided in the travel path of the target 1 for the purpose of collecting unconsumed residues from targets 1, and any targets 1 not irradiated by the pulsed laser beam L. The collecting tube 130 is equipped with a collecting mechanism 131. The collecting mechanism 131 includes a filter and a vacuum pump, and functions to trap debris 3 collected within the collecting tube 130 and discharge it to the exterior by applying a vacuum.

However, most of the debris 3 is not collected by the collecting tube 130 and remains suspended within the chamber 4. Leaving the debris 3 within the chamber 4 is desirable neither for the durability of the EUV light generator nor for the light output efficiency.

That is, high-speed ion debris 3 collides with optical elements such as the collector mirror 41, forming marks on smooth reflecting surfaces such as those of the collector mirror 41 and shortening the life of the optics.

Also, when the debris 3 deposits on an optical element such as a collector mirror 41, this lowers the reflectivity of EUV light, in turn lowering the output of EUV light.

Moreover, gasification of the debris 3 lowers the degree of vacuum within the chamber 4, reducing the propagation efficiency of the EUV light and decreasing the output of EUV light.

The following conventional art exists for collecting debris.

Conventional Art 1

Patent Document 1 below describes a technique for discharging debris from a "cryotarget" (a substance which is a gas at ambient temperature) outside of the chamber using a vacuum pump.

Conventional Art 2

Patent Document 2 below describes a technique in which a transmission filter is placed on the incident side of a return mirror in an illumination optical system, and debris included in the path of EUV light reflected by the collector mirror is adsorbed or absorbed with the transmission filter.

Patent Document 1: Japanese Patent Application Publication No. 2002-289397

Patent Document 2: Japanese Patent Application Publication No. 2000-349009

DISCLOSURE OF THE INVENTION

The conventional art 1 is a technique for the retroactive discharge and collection of gaseous debris with a vacuum pump. This would probably be of little use for debris that issues from the plasma-converted target and collides with the collector mirror at a high speed, and would most likely have a low debris collection efficiency.

The conventional art 2 is a technique for the retroactive collection of debris from the path of EUV light reflected by a collector mirror, and thus would be incapable of collecting debris that collides with or deposits on the collector mirror.

With the foregoing in view, it is an object of the present invention to provide a solution which, by efficiently collecting debris that issues from the plasma-converted target and collides with the collector mirror at a high speed and debris of the type that deposits on the collector mirror, improves the durability of the collector mirror and other optical elements within the chamber, maintains the degree of vacuum within the chamber, and suppresses a decrease in the output of EUV light.

Accordingly, a first aspect of the invention provides a debris collector in an EUV light generator, which is adapted for use in an EUV light generator in which a target is irradiated with a laser beam from laser beam irradiating means so as to render the target into a plasma state and thereby generating EUV light, and which collects debris that arises in the course of plasma formation, wherein debris collecting means disposed opposite to, of all the faces on the target, the face irradiated by the laser beam collects debris.

The present invention was made based on the finding that the greatest amount of debris 3 forms on, of all the faces on the target 1 (plasma 2), the side of the face irradiated by the laser beam L (i.e., forms in a direction perpendicular to the irradiated face).

In the first aspect of the invention, as shown in FIG. 4, debris collecting means 30 which collects debris is disposed opposite to, of all the faces of the target 1, the face that is irradiated with the laser beam L. Because the greatest amount of debris 3 forms on the side of the face irradiated by the laser beam L, the large amount of debris 3 that has formed is efficiently collected by the debris collecting means (collecting tube) 30 disposed opposite the laser irradiated face. The debris 3 is efficiently collected and does not collide with or deposit on optical elements within the chamber 4, such as a collector mirror 41. As a result, the durability of optical elements within the chamber 4, including the collector mirror 41, is improved, the degree of vacuum within the chamber 4 is maintained, and a decrease in EUV light output is suppressed.

A second aspect of the invention provides a debris collector in an EUV light generator, which is adapted for use in an EUV light generator in which a traveling target is irradiated with a laser beam from laser beam irradiating means to render the target into a plasma state and thereby generate EUV light, and which collects debris that arises in the course of plasma formation, wherein the laser beam irradiating means is disposed such that the direction of irradiation by the laser beam faces the traveling direction of the target, and debris collecting means for collecting debris is disposed in the traveling direction of the target.

In the second aspect of the invention, as shown in FIG. 1, the laser beam irradiating means 10 is disposed so that the direction of irradiation by the laser beam L faces the direction of travel by the target 1. Moreover, debris collecting means 30 for collecting debris 3 is disposed in the direction of travel by the target 1.

According to the second aspect of the invention, because the laser beam L is irradiated at the oncoming target 1, the greatest amount of debris 3 forms on the side of the target 1 in the direction of travel thereby; that is, the irradiated face side of the target 1. This large amount of generated debris 3 is collected on the side of the target 1 in the direction of travel by the target 1.

The debris 3 spreads out while moving toward the debris collecting means 30 at an initial velocity which is the velocity of travel by the target 1 at the time of irradiation by the laser beam L. Because the debris 3 moves rapidly toward the debris collecting means 30 at a velocity corresponding to the velocity of travel by the target 1, the debris 3 is able to reach the debris collecting means 30 before it spreads over a wide area. Hence, the collection efficiency of the debris 3 is better than in the first aspect of the invention.

By accelerating the target 1, the time until the debris 3 reaches the debris collecting means 30 can be further shortened, thereby increasing even more the collection efficiency of the debris 3.

A third aspect of the invention provides a debris collector in an EUV light generator according to the above-described first aspect of the invention comprising plasma-generating laser beam irradiating means for irradiating the target with plasma-generating laser beam of an energy level sufficient for converting the target into a plasma state, and plasma-heating laser beam irradiating means for irradiating the target with plasma-heating laser beam of an energy level sufficient for heating the target which is converted into a plasma state and generating EUV light, wherein the debris collecting means is disposed opposite, of all the faces on the target, the face that is irradiated with the plasma-generating laser beam.

This aspect of the invention is based on our findings that the greatest amount of debris 3 is generated at the beginning of laser irradiation, that debris 3 is generated less readily as the irradiation energy of the laser beam L diminishes, and that the amount of debris 3 generated can be held down by lowering the irradiation energy at the beginning of laser irradiation.

According to this third aspect of the invention, as shown in FIG. 5, a plasma-generating laser beam L1 of an energy level appropriate for converting the target 1 into a plasma state is irradiated from plasma-generating laser beam irradiating means 11. Next, a plasma-heating laser beam L2 of an energy level appropriate for heating the target 1 converted into a plasma state and generating EUV light is irradiated from plasma-heating laser beam irradiating means 12. The debris collecting means 30 is disposed opposite, of all the faces on the target 1, the face that is irradiated with the plasma-generating laser beam L1.

By irradiating the target 1 with a plasma-generating laser beam L1 of a relatively low energy level, the amount of debris 3 initially generated can be reduced. Also, as in the first aspect of the invention, the debris 3 generated is efficiently collected by debris collecting means 30 disposed on the irradiated face side of the target 1. EUV light is generated by using a plasma-heating laser beam L2 having a relatively high energy level to irradiate the target 1 that has been rendered into a plasma state.

A fourth aspect of the invention provides a debris collector in an EUV light generator according to the above-described second aspect of the invention comprising plasma-generating laser beam irradiating means for irradiating a target with plasma-generating laser beam of an energy level sufficient for converting the target into a plasma state, and plasma-heating laser beam irradiating means for irradiating the target with plasma-heating laser beam of an energy level sufficient for heating the target which is converted into a plasma state and generating EUV light, wherein the plasma-generating laser beam irradiating means is disposed such that the direction of plasma-generating laser beam irradiation faces the traveling direction of the target.

According to this fourth aspect of the invention, as shown in FIG. 5, a plasma-generating laser beam L1 of an energy level appropriate for converting the target 1 into plasma state is irradiated from plasma-generating laser beam irradiating means 11. Next, a plasma-heating laser beam L2 of an energy level appropriate for heating the target 1 converted into a plasma state and generating EUV light is irradiated from plasma-heating laser beam irradiating means 12. The plasma-generating laser beam irradiating means 11 is disposed such that the direction of plasma-generating laser beam L1 irradiation faces the direction of travel by the target 1.

By irradiating the target 1 with a plasma-generating laser beam L1 of a relatively low energy level, the amount of debris 3 initially generated can be reduced. Also, as in the second aspect of the invention, because the debris 3 moves rapidly toward the debris collecting means 30 at a velocity corresponding to the velocity of movement by the target 1, the debris 3 is able to reach the debris collecting means 30 before it spreads over a wide area, further improving the collection efficiency of the debris 3. Moreover, EUV light is generated by irradiating the target 1 that has been rendered into a plasma state with a plasma-heating laser beam L2 having a relatively high energy level.

A fifth aspect of the invention provides a debris collector in an EUV light generator according to the above-described first aspect of the invention comprising laser beam irradiating means for irradiating the target first with a plasma-generating laser beam of an energy level sufficient for converting the target into a plasma state, then with a plasma-heating laser beam of an energy level sufficient for heating the target which is converted into a plasma state and generating EUV light.

According to the fifth aspect of the invention, as shown in FIG. 7, the target 1 is irradiated with a plasma-generating laser beam L1 and a plasma-heating laser beam L2, at a time interval therebetween, from laser beam irradiating means 10.

By first irradiating the target 1 with a plasma-generating laser beam L1 of a relatively low energy level, the amount of debris 3 that initially forms can be reduced. By then irradiating the target 1 that has been rendered into a plasma with a plasma-generating laser beam L2 of a relatively high energy level, EUV light is generated.

Moreover, as in the first aspect of the invention, the debris 3 that has formed is efficiently collected by debris collecting means 30 disposed on the irradiation face side of the target 1.

In this fifth aspect of the invention, because the target 1 is irradiated with a plasma-generating laser beam L1 and a plasma-heating laser beam L2 from the same laser beam irradiation means 10, it is possible for the apparatus to have a simpler construction than in the third aspect of the invention.

A sixth aspect of the invention provides a debris collector in an EUV light generator according to the above-described second aspect of the invention comprising laser beam irradiating means for irradiating the target first with a plasma-generating laser beam of an energy level sufficient for converting the target into a plasma state, then with a plasma-heating laser beam of an energy level sufficient for heating the target which is converted into a plasma state and generating EUV light.

According to the sixth aspect of the invention, as shown in FIG. 7, the target 1 is irradiated with a plasma-generating laser beam L1 and a plasma-heating laser beam L2, at a time interval therebetween, from laser beam irradiating means 10.

By first irradiating the target 1 with a plasma-generating laser beam L1 of a relatively low energy level, the amount of debris 3 that initially forms can be reduced. By then irradiating the target 1 that has been rendered into a plasma with a plasma-generating laser beam L2 of a relatively high energy level, EUV light is generated.

Moreover, as in the second aspect of the invention, because the debris 3 moves rapidly toward the debris collecting means 30 at a velocity corresponding to the velocity of travel by the target 1, the debris 3 is able to reach the debris collecting means 30 before it spreads out over a wide area, further improving the collection efficiency of the debris 3.

A seventh aspect of the invention provides a debris collector in an EUV light generator according to the above-described first aspect of the invention, wherein the debris collecting means is a tube having a debris-holding space, the tube being formed therein a space through which the laser beam is allowed to pass.

The seventh aspect technically limits the debris collecting means 30 according to the first aspect of the invention to a collecting tube 30. As shown in FIG. 4, the laser beam L passes through a space formed in the collecting tube 30 and irradiates the target 1, following which the debris 3 is collected in the space formed in the collecting tube 30.

An eighth aspect of the invention provides a debris collector in an EUV light generator according to the above-described second aspect of the invention, wherein the debris collecting means is a tube having a debris-holding space, the tube being formed therein a space through which the laser beam is allowed to pass.

The eighth aspect technically limits the debris collecting means 30 according to the second aspect of the invention to a collecting tube 30. As shown in FIG. 1, the laser beam L passes through a first space 33 formed in the collecting tube 30 and irradiates the target 1, following which the debris 3 is collected in a second space 32 formed in the collecting tube 30.

A ninth aspect of the invention provides a debris collector for an EUV light generator according to the above-described first aspect of the invention, wherein the debris collecting means is a tube having a debris-holding space and an optical system is disposed so that the laser beam passes outside of the tube.

The ninth aspect technically limits the first aspect of the invention. As shown in FIG. 3, the debris collecting means 30 is a collecting tube 30 having a space which holds the debris 3, and the laser beam L passes outside of the collecting tube 30 via optics 21 and 22 and irradiates the target 1.

In this ninth aspect, there is no need to form in the collecting tube 30 a space for the laser beam L to pass through, making more space available in the collecting tube 30 for holding debris and thus further increasing the collection efficiency of the debris 3.

A tenth aspect of the invention provides a debris collector for an EUV light generator according to the above-described second aspect of the invention, wherein the debris collecting means is a tube containing a debris-holding space and an optical system is disposed so that the laser beam passes outside of the tube.

The tenth aspect technically limits the second aspect of the invention. As shown in FIG. 3, the debris collecting means 30 is a collecting tube 30 having a space which holds the debris 3, and the laser beam L passes outside of the collecting tube 30 via optics 21 and 22 and irradiates the target 1.

In this tenth aspect, there is no need to form in the collecting tube 30 a space for the laser beam L to pass through, making more space available in the collecting tube 30 for holding debris and thus further increasing the collection efficiency of the debris 3.

An eleventh aspect of the invention provides a debris collector in an EUV light generator, which is adapted for use in an EUV light generator in which an advancing target is irradiated with a laser beam from laser beam irradiating means so as to render the target into a plasma state and thereby generating EUV light, and which collects debris that arises in the course of plasma formation, wherein the debris includes charged particles, and the debris collecting means for collecting debris is disposed in the traveling direction of the target, and magnetic line generating means for generating magnetic lines of force that guide the charged particles to the debris collecting means is provided.

In this eleventh aspect of the invention, as shown in FIG. 8, the debris 3 spreads out at a velocity v. At the same time, magnetic lines of force 51 are formed by magnetic flux generating means 50. The velocity v of the debris 3 is the sum of a component velocity v1 in a direction perpendicular to the magnetic lines of force 51 and a component velocity v2 parallel to the magnetic lines of force 51. Lorentz forces come to bear on the charged particles making up the debris 3, leading to capture by the magnetic lines of force 51. That is, the debris 3 moves at a parallel component velocity v2 in a direction parallel to the magnetic lines of force 51 while undergoing cyclotron motion at a radius corresponding to the perpendicular component velocity v1, and is thereby guided to the debris collecting means 30.

According to this eleventh aspect of the invention, the debris 3 that would otherwise spread out and be difficult to collect can be reliably captured by magnetic lines of force 51 and reliably guided to the debris collecting means 30, thus enabling the collection efficiency of the debris 3 to be increased.

A twelfth aspect of the invention provides a debris collector in an EUV light generator according to the above-described eleventh aspect of the invention, wherein the laser beam irradiating means is disposed such that the direction of laser beam irradiation faces the traveling direction of the target.

In this twelfth aspect, as shown in FIG. 8(a), because the laser beam L is irradiated directly at the oncoming target 1, the greatest amount of debris 3 forms on the side of the target 1 in the direction of travel thereof; that is, the irradiated face side of the target 1.

This large amount of debris 3 that forms spreads out at a velocity v while preserving the momentum of the target 1 in the direction of travel. The component velocity v2 of the debris 3 in a direction parallel to the magnetic lines of force 51 increases with the velocity of movement by the target 1. Because the debris 3 advances rapidly along the magnetic lines of force 51 and toward the debris collecting means 30 at a velocity v2 which corresponds to the velocity of travel by the target 1, the debris 3 is able to reach the debris collecting means 30 before it spreads out over a wide area. Hence, the collection efficiency of the debris 3 is better than in the foregoing eleventh aspect of the invention. In addition, by accelerating the target 1, the time until the debris 3 reaches the debris collection means 30 can be shorted, enabling the collection efficiency of the debris 3 to be increased even further.

A thirteenth aspect of the invention provides a debris collector in an EUV light generator according to the above-described twelfth aspect of the invention comprising plasma-generating laser beam irradiating means for irradiating a target with a plasma-generating laser beam of an energy level sufficient for converting the target into a plasma state, and plasma-heating laser beam irradiating means for irradiating the target with a plasma-heating laser beam of an energy level appropriate for heating the target converted into a plasma state and generating EUV light, wherein the plasma-generating laser beam irradiating means is disposed such that the direction of plasma-generating laser beam irradiation faces the traveling direction of the target.

This thirteenth aspect is a combination of the twelfth and the fourth aspects of the invention, and can reduce the amount of debris 3 that initially forms.

A fourteenth aspect of the invention provides a debris collector in an EUV light generator according to the above-described twelfth aspect of the invention comprising the laser bean irradiating means for irradiating the target first with a plasma-generating laser beam of an energy level sufficient for converting the target into a plasma state, then with a plasma-heating laser beam of an energy level sufficient for heating the target which is converted into a plasma state and generating EUV light.

This fourteenth aspect is a combination of the twelfth and the sixth aspects of the invention. It can reduce the amount of debris 3 that initially forms and enables the configuration of the apparatus to be simplified.

A fifteenth aspect of the invention provides a debris collector for an EUV light generator according to the twelfth aspect of the invention, wherein the debris collecting means is a tube having a debris-holding space, the tube being formed therein a space through which the laser beam is allowed to pass.

In this fifteenth aspect, as in the eighth aspect, the laser beam L passes through a space formed in the collecting tube 30 and irradiates the target 1, following which the debris 3 is collected in a space formed in the collecting tube 30.

A sixteenth aspect of the invention provides a debris collector for an EUV light generator according to the twelfth aspect of the invention, wherein the debris collecting means is a tube having a debris-holding space and an optical system is disposed so that the laser beam passes outside of the tube.

In this sixteenth aspect, as in the tenth aspect described above, the laser beam L passes outside the collecting tube 30 via optics 21 and 22 and irradiates the target 1.

In this sixteenth aspect, there is no need to form in the collecting tube 30 a space for the laser beam L to pass through, making more space available in the tube 30 for holding debris and thus further increasing the collection efficiency of the debris 3.

BEST MODE FOR CARRYING OUT THE INVENTION

Embodiments of the debris collector in an EUV light generator according to the invention are described below in conjunction with the attached diagrams.

Embodiment 1

Figure 1A:
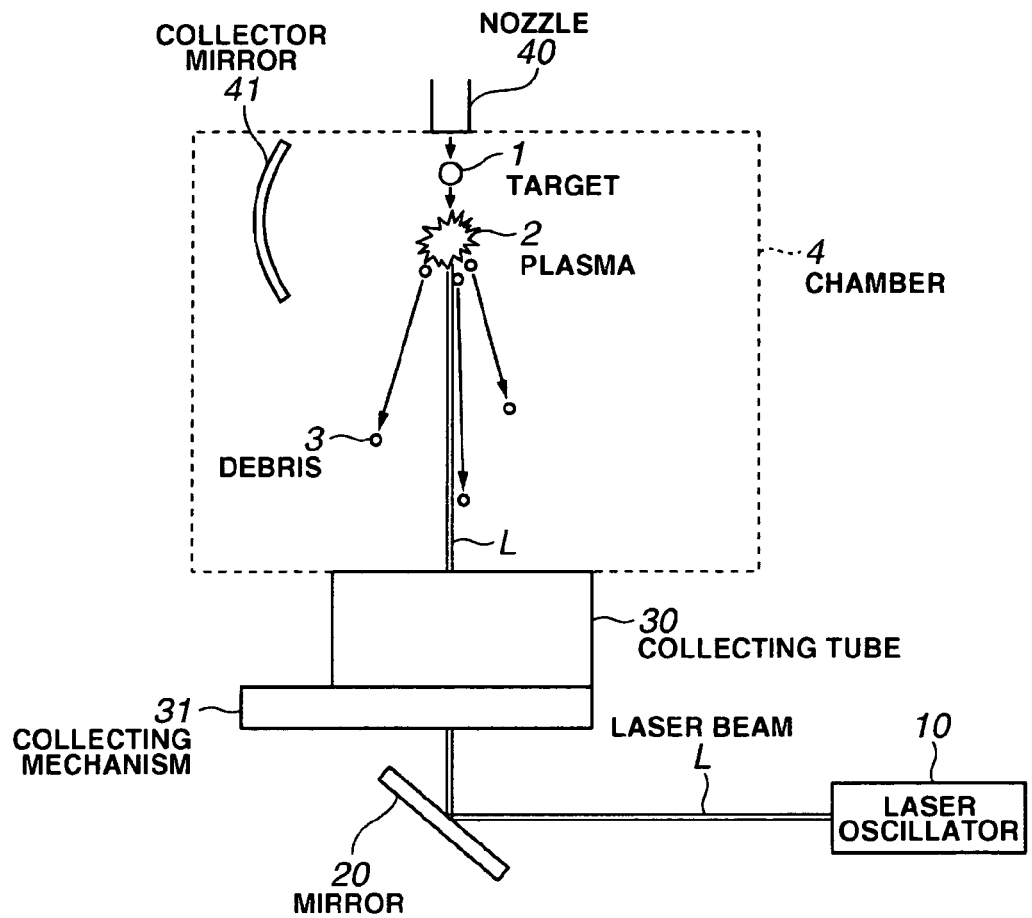
FIGS. 1(a) and (b) show examples of arrangements according to a first embodiment of the invention.

FIG. 1(a) shows an arrangement of an EUV light generator in a first embodiment of the invention.

A collector mirror 41 which collects EUV light is provided at the interior of a chamber 4. The EUV light collected by the collector mirror 41 is transmitted to illumination optics (not shown) outside of the chamber 4 and used to form a semiconductor circuit pattern on a semiconductor wafer.

A device such as vacuum pump is used to draw a vacuum on the interior of the chamber 4 and place the chamber in a vacuum state. This is done because EUV light has a short wavelength of 13.5 nm and does not propagate efficiently except in a vacuum.

The liquid target 1, which is an EUV light-generating substance, is released in the form of a droplet from the nozzle 40. For example, liquid xenon (Xe) may be used as the target 1. The target 1 has a diameter of about 10 μm. Other substances that may be used as the target 1 include tin-containing liquids and indium-containing liquids.

Alternatively, instead of having the target 1 fall as a droplet from the nozzle 40, the target 1 may be ejected from the nozzle 40.

The laser oscillator 10 may be, for example, a YAG laser, and pulse generates a near-infrared laser beam L. The laser oscillator 10 and a mirror 20 are arranged in such a way as to orient the laser beam L in a direction that faces the direction of travel by the target 1.

A collecting tube 30 is provided in the direction of travel by the target 1.

That is, in the diagram, the mirror 20 is situated downward from the collecting tube 30 and the laser oscillator 10 is situated to the right of the mirror 20. In the diagram, the laser beam L from the laser oscillator 10 is output leftward and directed to the mirror 20, then reflected by the mirror 20 through a 90° change in direction and continues upward.

In the arrangement shown in FIG. 1(a), providing the mirror 20 enables the laser oscillator 10 to be positioned lateral to the collecting tube 30. However, it is possible instead to position the laser oscillator 10 directly below the collecting tube 30 and output the laser beam L directly upward without having it pass by the mirror 20.

In the arrangement in FIG. 1(a), the ability to position the laser oscillator 10 lateral to the collecting tube 30 reduces the amount of room taken up by the apparatus in the vertical direction.

Figure 1B:
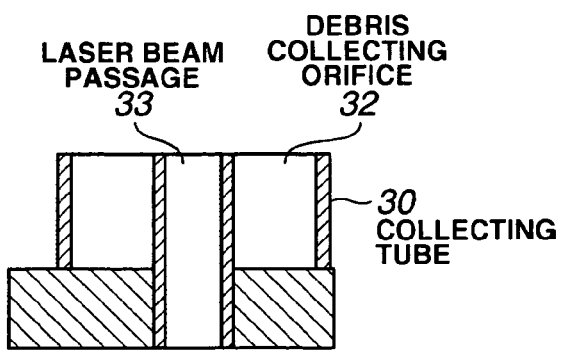

FIG. 1(b) shows a cross-sectional view of the collecting tube 30. The collecting tube 30 has formed therein a laser beam passage 33 which extends all the way through the collecting tube 30 in the vertical direction and allows the laser beam L to pass through the collecting tube 30.

The laser beam L passes through the laser beam passage 33 in the collecting tube 30, and irradiates the bottom face of the target 1 that is dropped downward in the diagram.

When the laser beam L irradiates the target 1, the target 1 is excited to a plasma state, generating EUV light. The plasma 2 that forms has a diameter of from several tens of microns to about 1 mm. The generated EUV light spreads out in all directions from the plasma 2 at the center. A collector mirror 41 is disposed so as to surround the plasma 2. The EUV light which spreads out in all directions is collected by the collector mirror 41, and the collected EUV light is reflected and thereby guided to illumination optics.

A portion of the target 1 fragments and scatters under the influence of shock waves and the like at the time of plasma generation, forming debris 3. The debris 3 includes high-speed ions, which are charged particles, and residues that have not be converted into a plasma state.

As shown in FIG. 1(b), the collecting tube 30 has formed therein a debris collecting orifice 32 which is a space the collects debris 3. In addition, the collecting tube 30 is also equipped with a collecting mechanism 31. The collecting mechanism 31, which includes a filter and a vacuum pump, traps debris 3 that has been received within the collecting tube 30 and discharges the debris to the exterior by applying a vacuum.

We have found that, of all the faces on the target 1 (plasma 2), the greatest amount of debris 3 forms on the side of the face of the target 1 that is irradiated with the laser beam L (the direction perpendicular to the irradiated face).

In arrangement (a) of this first embodiment of the invention, of all the faces of the target 1, the collecting tube 30 is provided opposite the laser-irradiated face (bottom face of the target 1).

Therefore, the large amount of debris 3 that forms on the side of the laser-irradiated face of the target 1 is efficiently collected in the debris collecting orifice 32 of the collecting tube 30. The debris 3 is efficiently collected without debris 3 colliding with or depositing on the collector mirror 41 and other optical elements within the chamber 4. Hence, the durability of the collector mirror 41 and other optical elements within the chamber 4 is improved, the degree of vacuum in the chamber 4 is maintained, and a decrease in the output of EUV light is suppressed.

In arrangement (b) of this first embodiment, the collecting tube 30 is provided in the direction of travel by the target 1.

The debris 3 spreads out while preserving the momentum of the target 1 at the time of irradiation by the laser beam L. The debris 3 spreads out while advancing on the collecting tube 30 side at an initial velocity equal to the velocity of travel by the target 1 when it is irradiated by the laser beam L. Because the debris 3 advances rapidly on the side of the collecting tube 30 at a velocity which corresponds to the velocity of travel by the target 1, the debris 3 is able to reach the collecting tube 30 before it spreads out over a wide area. The collection efficiency of the debris 3 can thus be increased.

A prior application (Unpublished Japanese Patent Application No. 2002-103975) by the present applicant discloses an arrangement (c) in which the target 1 is accelerated by an accelerator, thereby making the velocity of travel by the target 1 as high or higher than the velocity of travel by the plasma 2.

The first embodiment may also be practiced as a combination of any of the foregoing arrangements.

By accelerating the target 1, the time until the debris 3 reaches the collecting tube 30 can be further shortened, the debris can be collected in the collecting tube 30 before it spreads out, and the collection efficiency of the debris 3 can be further increased.

In the arrangement shown in FIG. 1, it is anticipated that part of the debris 3 will pass through the laser beam passage 33 without being collected by the debris collecting orifice 32, and deposit on the mirror 20.

Figure 2:
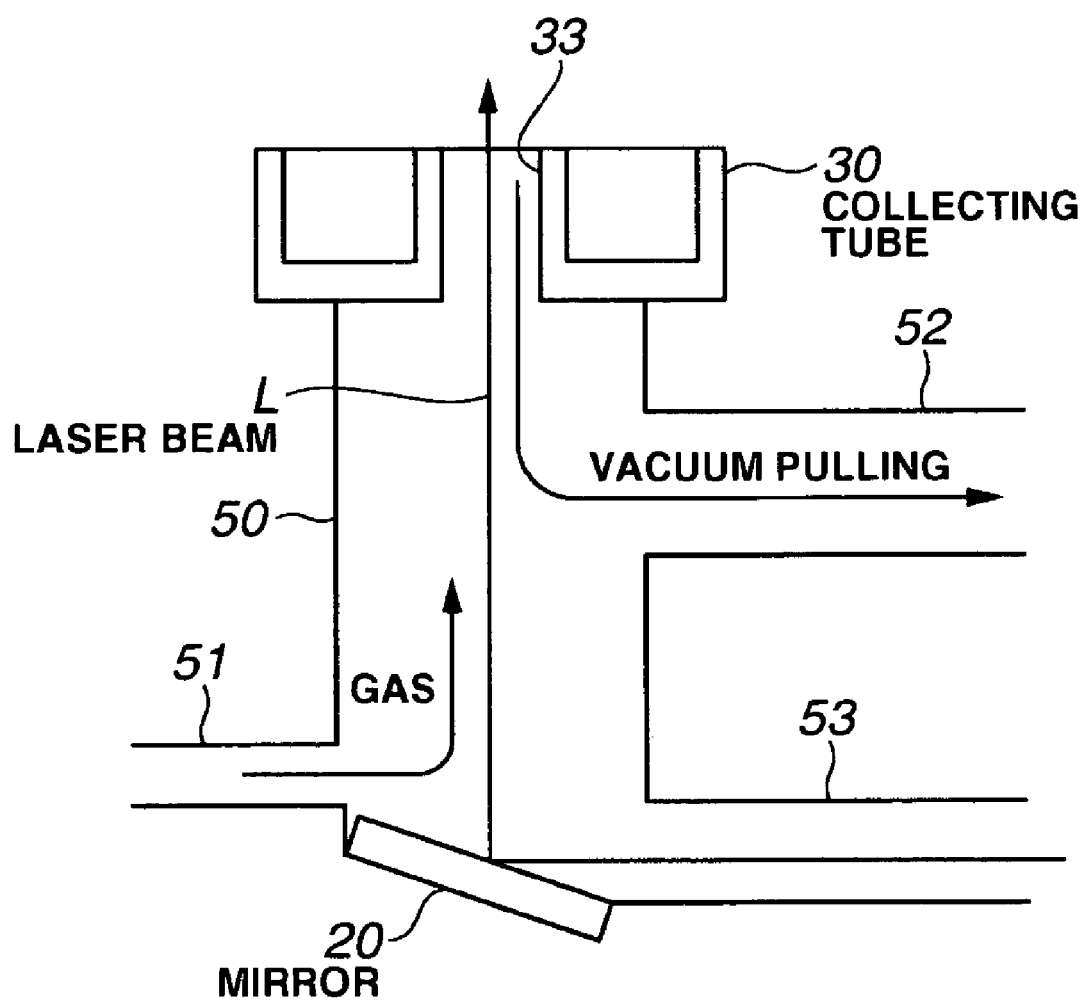
FIG. 2 shows an example of an arrangement for preventing debris from depositing on the mirror in FIG. 1.

Therefore, to prevent deposition of the debris 3 on the mirror 20, an arrangement like that shown in FIG. 2 may be used.

In FIG. 2, a gas chamber 50 is provided between the collecting tube 30 and the mirror 20. A gas inlet line 51, a vacuum line 52 and a laser beam line 53 are connected within the gas chamber 50. The vacuum line 52 communicates with the intake of a vacuum pump. The laser beam L is directed through the laser beam line 53 to the gas chamber 50, where it falls on a mirror 20, then passes through the gas chamber 50 and is guided to a laser beam passage 33 in the collecting tube 30.

A purge gas is carried to the gas chamber 50 by the gas inlet line 51. The debris 3 that passes through the laser beam passage 33 and enters the gas chamber 50 is discharged from the gas chamber 50 together with the purge gas through the vacuum line 52. That is, the debris 3 is purged outside of the gas chamber 50 without allowing it deposit on the mirror 20.

Embodiment 2

In the first embodiment described above, a laser beam passage 33 is formed in the collecting tube 30 so as to allow the laser beam L to pass therethrough. However, an arrangement in which the laser beam L passes by outside of rather than through the collecting tube 30 is also possible.

Figure 3A:
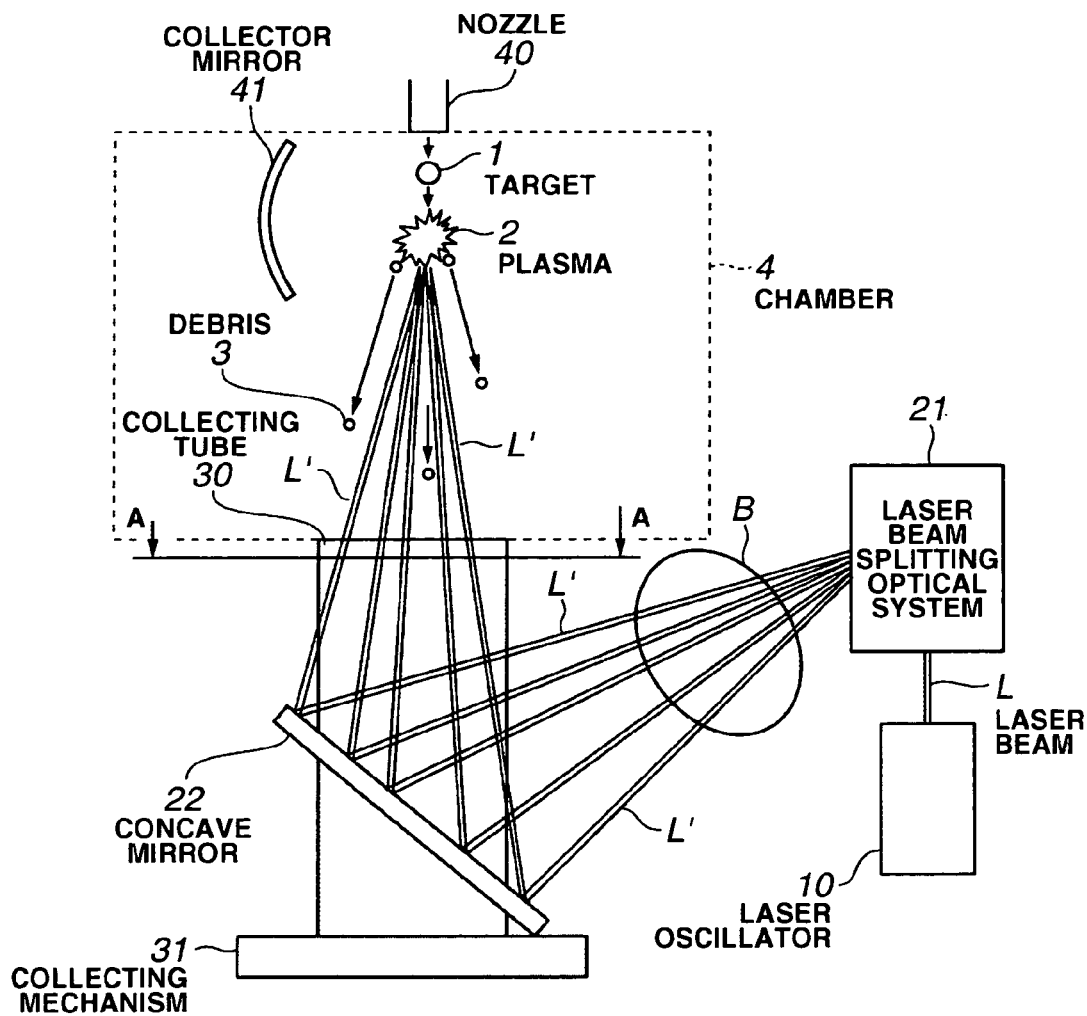
FIGS. 3(a) and (b) show an example of arrangement according to a second embodiment of the invention.
Figure 3B:
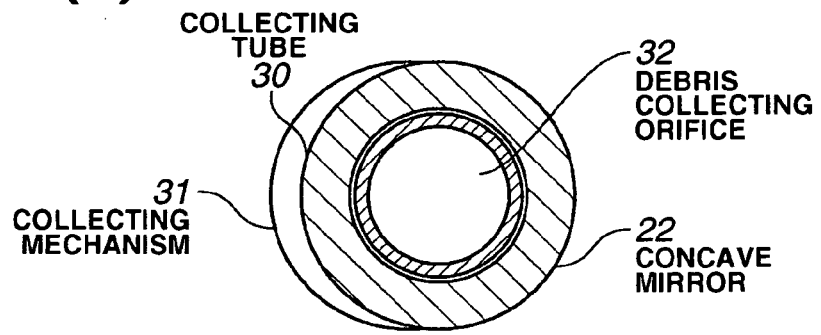

FIG. 3(a), which corresponds to FIG. 1(a), shows a second embodiment having an arrangement in which the laser beam L passes by outside of the collecting tube 30. FIG. 3(b) shows a cross section taken along the line A-A in FIG. 3(a). Explanations of features common to this embodiment and the first embodiment are omitted below as appropriate.

As shown in FIG. 3, a debris collecting orifice 32 is formed in the collecting tube 30. However, unlike the arrangement shown in FIG. 1, no laser beam passage 33 is formed. At the outer periphery of the collecting tube 30, an annular concave mirror 22 is positioned at an angle to the vertical axis.

A laser beam splitting optical system 21 is provided after the laser oscillator 10. The laser beam splitting optical system 21 splits the laser beam L into a plurality of laser beams L' and causes them to fall at various positions over the entire circumference of the concave mirror 22.

In FIG. 3, the laser beam L is split into a plurality of laser beams L' which are made to fall on the entire circumference of the concave mirror 22. However, by subjecting the laser beam L to surface reflection at the concave mirror 22 so that it has a substantially circular cross-section, the beam can be made to fall at all points over the entire circumference of the concave mirror 22.

When a plurality of laser beams L' fall on the concave mirror 22, the plurality of laser beams L' are reflected and converge in the upward direction in the diagram; that is, in a direction facing the direction of travel by the target 1. These plurality of laser beams L' strike the target 1 at the point where they converge.

In this second embodiment, because the formation of a space for passage of the laser beam L (laser beam passage 33) in the collecting tube 30 is not required, more space (debris collecting orifice 32) is available for holding the debris 3, thereby increasing further the collection efficiency of the debris 3.

This second embodiment also has arrangements (a) and (b) similar to those in the first embodiment, enabling a debris collection efficiency increasing effect to be achieved in the same way as in the first embodiment. Moreover, by combining arrangement (c) with the second embodiment, the debris collecting efficiency can be increased even further.

Embodiment 3

The above-described first and second embodiments have an arrangement (b) in which the collecting tube 30 is disposed in the travel path of the target 1.

However, the invention may also be practiced without this arrangement (b). Such an embodiment is shown in FIG. 4 as a third embodiment.

Figure 4:
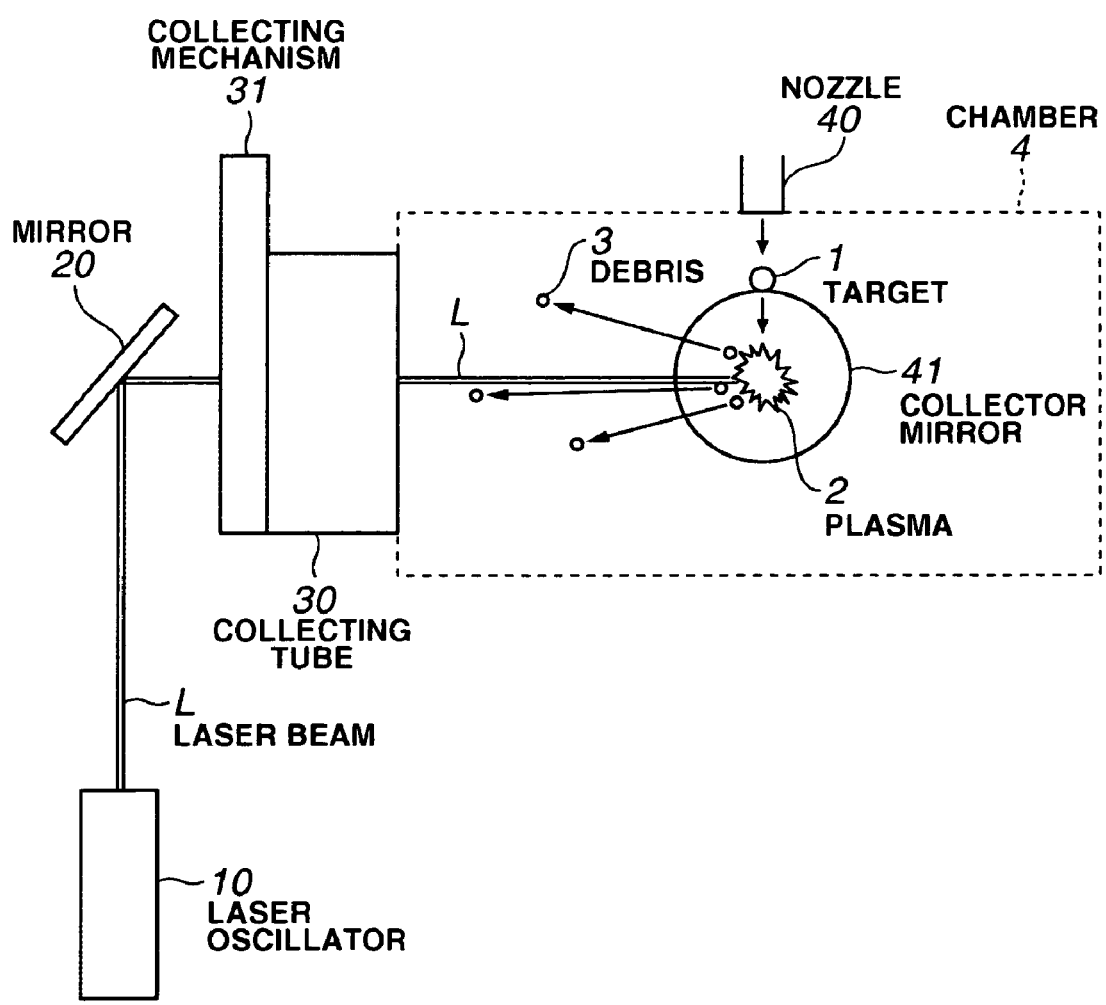
FIG. 4 shows an example of an arrangement according to a third embodiment of the invention.
Figure 11:
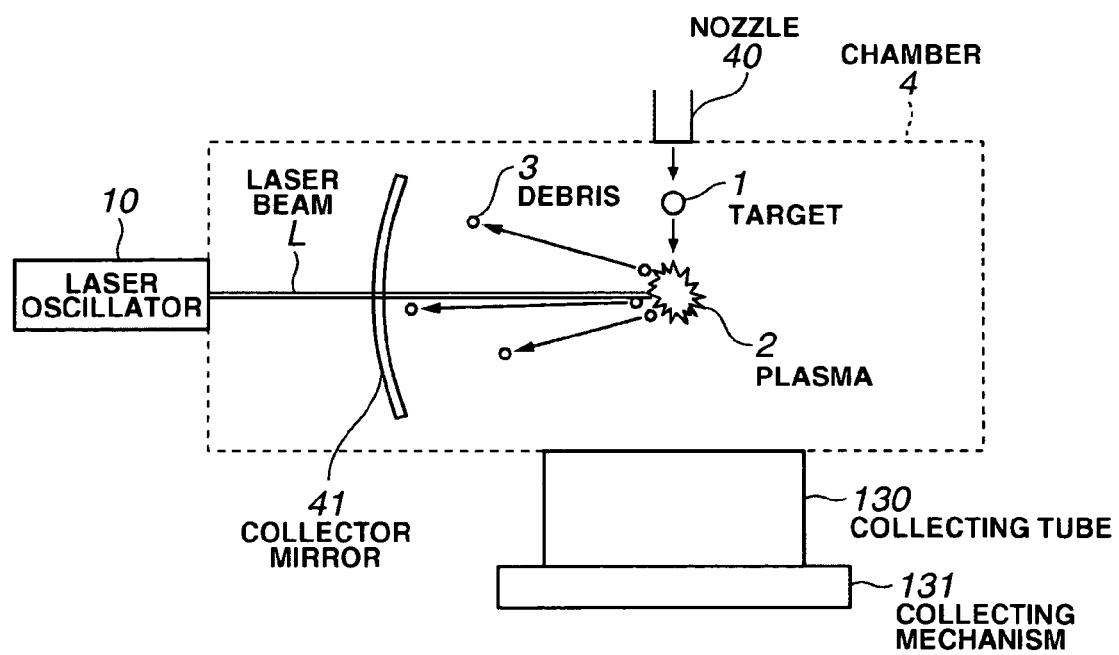
FIG. 11 is a diagram for explaining the construction of the EUV light generator.

As shown in FIG. 4, in this third embodiment, like the arrangement shown in FIG. 11, a laser oscillator 10 and a mirror 20 are disposed for irradiation by a laser beam L in a direction perpendicular to the direction of travel by the target 1.

That is, a collecting tube 30 is provided leftward of the nozzle 40. A mirror 20 is disposed leftward of the collecting tube 30. A laser beam L is output upward from the laser oscillator 10 and falls on the mirror 20. The laser beam L is reflected by the mirror 20, changes direction 90° and continues rightward in the diagram.

The laser beam L passes through a laser beam passage 33 in the collecting tube 30 and irradiates the left face of the target 1 that is dropped downward in the diagram.

In FIG. 1(a), providing the mirror 20 allows the laser oscillator 10 to be positioned below the collecting tube 30. However, placing the laser oscillator 10 on the left side of the collecting tube 30 at the same height position as the collecting tube 30 enables the laser beam L to be output directly rightward from the laser oscillator 10 without passing by a mirror 20.

This third embodiment has an arrangement (a) in which the collecting tube 30 is provided opposite the face, of all the faces of the target 1, which is irradiated by the laser beam (i.e., the left face).

Hence, the large amount of debris 3 that forms at the laser beam irradiated face side of the target 1 is efficiently collected in a debris collecting orifice 32 of the collecting tube 30. The debris 3 is efficiently collected without collision with or deposition on optical elements within the chamber 4, such as the collector mirror 41. As a result, the durability of the optical elements within the chamber 4, including the collector mirror 41, is enhanced, the degree of vacuum in the chamber 4 is maintained, and a decrease in EUV light output is suppressed.

Alternatively, the third embodiment may have an arrangement wherein, as in FIG. 3, the laser beam L passes outside of the collecting tube 30. Moreover, by combining arrangement (c) with this third embodiment, the debris collecting efficiency can be increased even further.

Fourth Embodiment

We have found that the greatest amount of debris 3 is generated at the start of laser irradiation, that debris 3 forms less readily when the irradiation energy of the laser beam L is lower, and that the amount of debris 3 generated can be held down by lowering the irradiation energy at the start of laser irradiation. Accordingly, a fourth embodiment which has a low irradiation energy at the start of laser irradiation and can suppress the amount of debris 3 generated is described here in conjunction with FIG. 5.

The fourth embodiment, in an arrangement similar to that in FIG. 1(a), has a mirror 20 disposed below the collecting tube 30, but positioned rightward of the mirror 20 is a plasma-generating laser oscillator 11 instead of the laser oscillator 10 in FIG. 1(a). The plasma-generating laser oscillator 11 outputs a plasma-generating laser beam L1 of an energy level appropriate for rendering the target 1 into a plasma state.

In addition, a plasma-heating laser oscillator 12 is positioned on the right side of the collecting tube 30 so as to output a plasma-heating laser beam L2 in a direction perpendicular to the direction of travel by the target 1. The plasma-heating laser oscillator 12 outputs a plasma-heating laser beam L2 of an energy level appropriate for heating the plasma-converted target 1 and generating EUV light.

First, a plasma-generating laser beam L1 from the plasma-generating laser oscillator 11 is output leftward in the diagram and falls on the mirror 20. The plasma-generating laser beam L1 is reflected by the mirror 20 through a 90° change in direction, and continues upward in the diagram.

Figure 5:
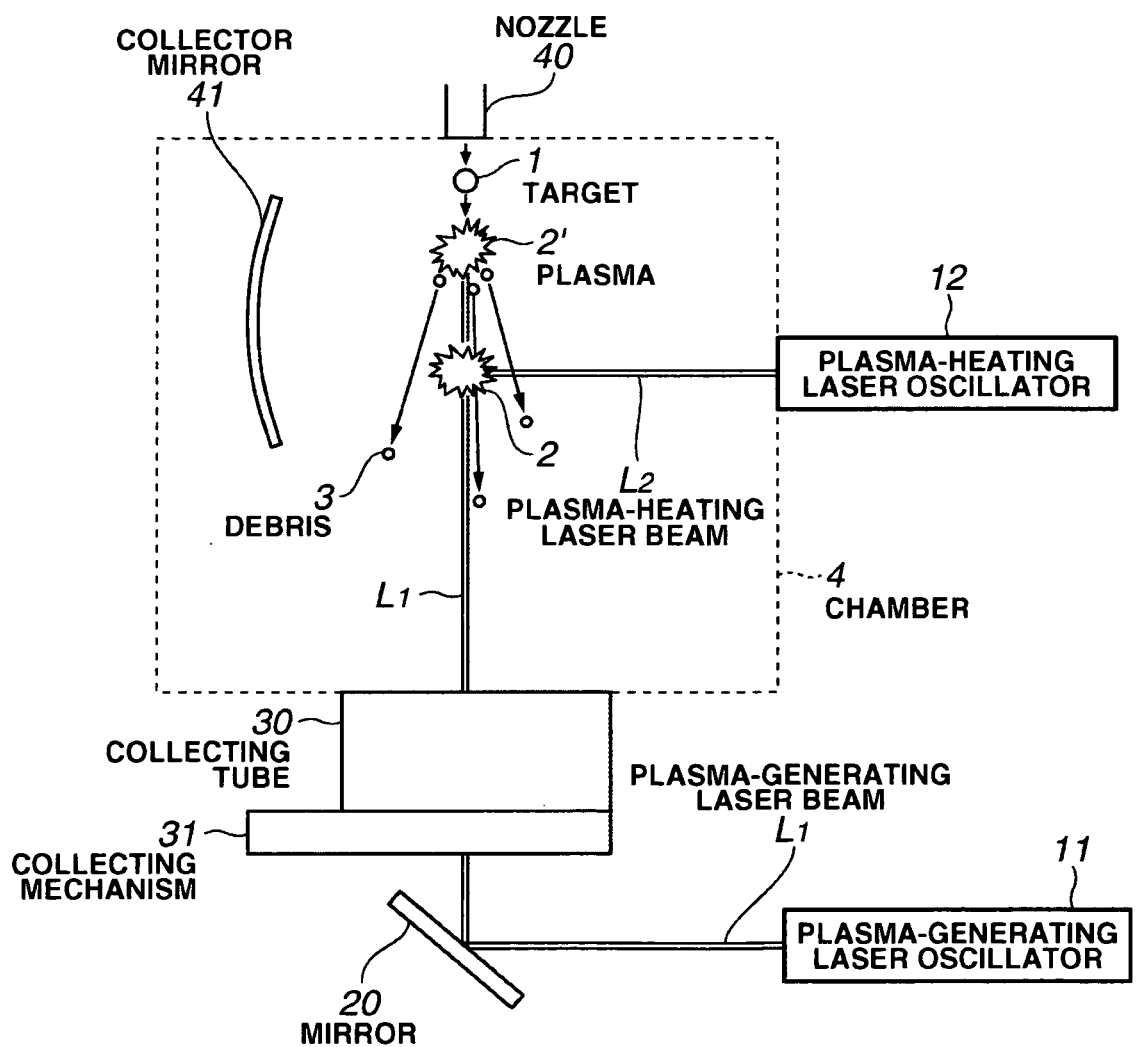
FIG. 5 shows an example of an arrangement according to a fourth embodiment of the invention.

In FIG. 5, by proving the mirror 20, the plasma-generating laser oscillator 11 can be positioned lateral to the collecting tube 30. However, placing the plasma-generating laser oscillator 11 directly below the collecting tube 30 allows the plasma-generating laser beam L1 to be output directly upward without passing by a mirror 20.

In the arrangement shown in FIG. 5, the ability to position the plasma-generating laser oscillator 11 lateral to the collecting tube 30 reduces the amount of room taken up by the apparatus in the vertical direction.

The plasma-generating laser beam L1 passes through the laser beam passage 33 in the collecting tube 30, and irradiates the bottom face of a target 1 that is dropped downward in the diagram.

The target 1 is rendered into plasma 2' by irradiating the target 1 with a plasma-generating laser beam L1 having a relatively low energy level, but this plasma 2' is not of a high temperature appropriate for generating EUV light. By irradiating the target 1 with the plasma-generating laser beam L1 of a relatively low energy level, the amount of debris 3 that forms initially can be reduced.

After an interval of time following output of the plasma-generating laser beam L1, a plasma-heating laser oscillator 12 outputs a plasma-heating laser beam L2 toward the left in the diagram, which plasma-heating laser beam L2 irradiates the righthand face of the plasma-converted target 1.

Irradiating the plasma-converted target 1 with a plasma-heating laser beam L2 of a relatively high energy level results in the formation of a plasma 2 capable of generating EUV light and the generation of EUV light. The generated EUV light spreads out in all directions from the plasma 2 at the center. The EUV light that spreads out in all directions is collected by the collector mirror 41, and the collected EUV light is reflected and guided to illumination optics.

This fourth embodiment has the same arrangements (a) and (b) as in the first embodiment, and so the collecting efficiency of debris 3 can likewise be increased.

This fourth embodiment also has an arrangement (d) in which first a plasma-generating laser beam L1 of an energy level appropriate for rendering the target 1 into a plasma state is irradiated at the target 1, following which a plasma-heating laser beam L2 of an energy level appropriate for heating the target 1 that has been rendered into plasma and generating EUV light is output. This enables the amount of debris 3 initially formed to be reduced, and the collection efficiency of the debris 3 to be further enhanced.

By combining arrangement (c) with the fourth embodiment, the efficiency of debris collection can be increased even further. The fourth embodiment may also have an arrangement whereby, as in FIG. 3, the laser beam L passes outside of the collecting tube 30.

The above-described fourth embodiment has the arrangement (b) in which the collecting tube 30 is disposed in the direction of travel by the target 1, but this arrangement (b) can be excluded and the embodiment carried out with arrangements (a) and (d) only. That is, the plasma-generating laser oscillator 11 may be positioned in the same way as the laser oscillator 10 in FIG. 4 and the plasma-generating laser beam L1 output in a direction perpendicular to the direction of travel by the target 1.

Fifth Embodiment

Various modifications of the fourth embodiment are possible.

Figure 6:
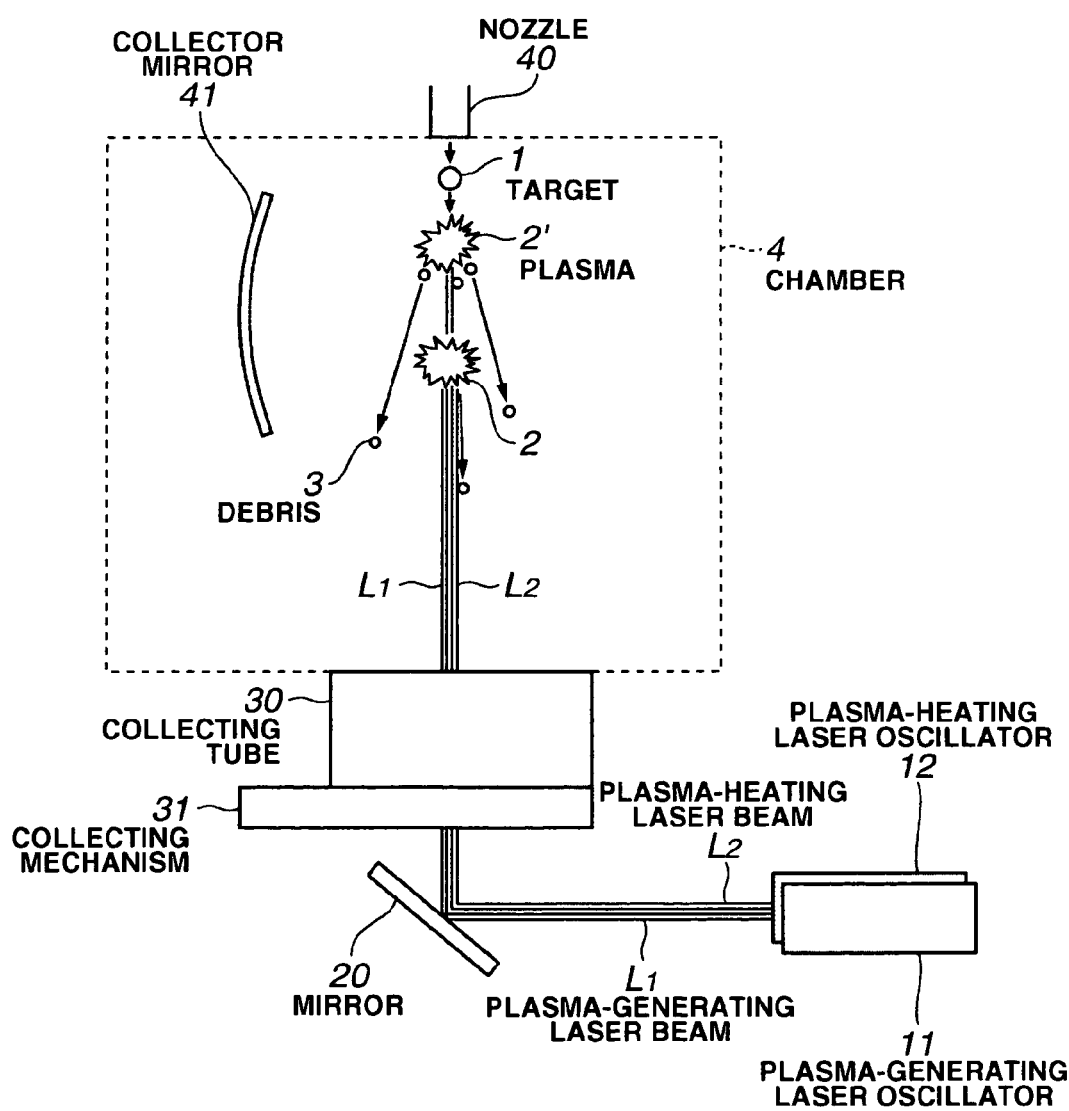
FIG. 6 shows an example of an arrangement according to a fifth embodiment of the invention.

FIG. 6 shows a fifth embodiment of the invention. A plasma-heating laser oscillator 12 is situated at the same position as the plasma-generating laser oscillator 11 in FIG. 5, and both a plasma-generating laser beam L1 and a plasma-heating laser beam L2 irradiate in a direction facing the direction of travel by the target 1.

By combining this fifth embodiment with arrangement (c), the debris collecting efficiency can be further enhanced. Alternatively, the fifth embodiment may have an arrangement like that in FIG. 3 in which the laser beam L passes outside of the collecting tube 30.

The fifth embodiment has an arrangement (b) in which the collecting tube 30 is disposed in the direction of travel by the target 1, although this arrangement (b) may be omitted and the present embodiment worked using with only arrangements (a) and (d). That is, the fifth embodiment may be worked by placing a plasma-generating laser oscillator 11 and a plasma-heating laser oscillator 12 in positions like that of the laser oscillator 10 in FIG. 4, and irradiating both the plasma-generating laser beam L1 and the plasma-heating laser beam L2 in a direction perpendicular to the direction of travel by the target 1.

Sixth Embodiment

Figure 7:
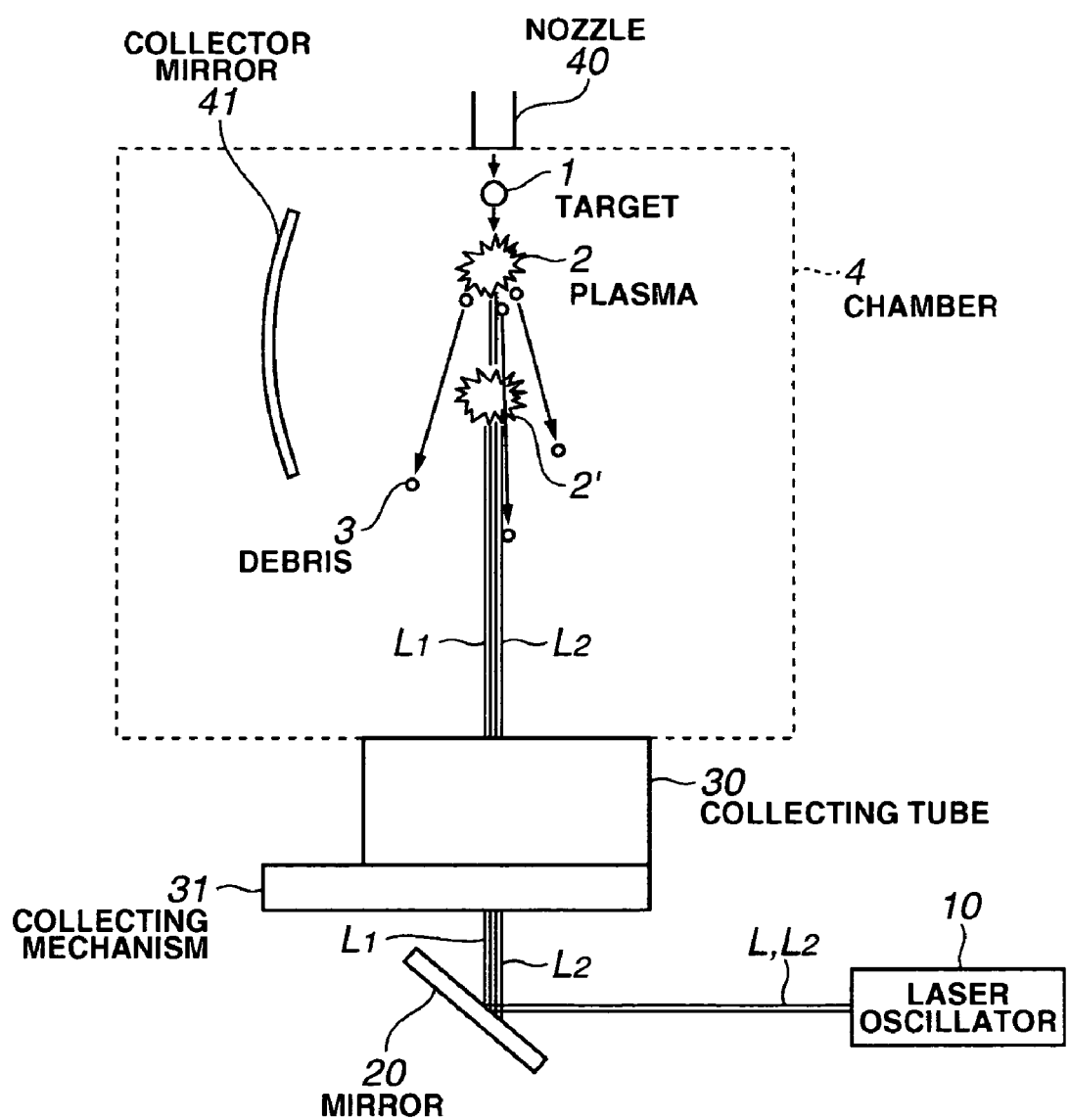
FIG. 7 shows an example of an arrangement according to a sixth embodiment of the invention.

FIG. 7 shows the arrangement in a sixth embodiment of the invention. Here, a laser oscillator 10 is situated at the same position as the plasma-generating laser oscillator 11 in FIG. 5. Both a plasma-generating laser beam L1 and a plasma-heating laser beam L2 are output from the laser oscillator 10 and irradiate in a direction facing the direction of travel by the target 1.

That is, a plasma-generating laser beam L1 of a relatively low energy level is output from the laser oscillator 10 and irradiates the target 1. This enables the amount of debris 3 that forms initially to be reduced. Next, after a time interval following output of the plasma-generating laser beam L1, a plasma-heating laser beam L2 having a relatively high energy level is output from the laser oscillator 10 and irradiates the target 1 that has been rendered into a plasma state. This results in the generation of EUV light. Next, as in the fourth and fifth embodiments, the debris 3 that has formed is efficiently collected by a collecting tube 30 positioned on the irradiated face side of the target 1.

In this sixth embodiment, because a plasma-generating laser beam L1 and a plasma-heating laser beam L2 are output from the same laser oscillator 10 and irradiate the target 1, the apparatus can be given a simpler construction than in the fourth and fifth embodiments in which the laser oscillators are separately provided.

By combining arrangement (c) with this sixth embodiment, the embodiment can be worked in such a way as to further increase the debris collecting efficiency. Moreover, the sixth embodiment may be given an arrangement in which, as in FIG. 3, the laser beam L passes outside of the collecting tube 30.

This sixth embodiment has an arrangement (b) in which the collecting tube 30 is disposed in the direction of travel by the target 1, although arrangement (b) may be omitted and this embodiment worked using only arrangements (a) and (d). That is, the sixth embodiment may be worked using an arrangement like that in FIG. 4 in which both the plasma-generating laser beam L1 and the plasma-heating laser beam L2 are irradiated in a direction perpendicular to the direction of travel by the target 1.

Seventh Embodiment

Next, a seventh embodiment 7 is described which can efficiently collect debris 3 that includes electrically charged particles.

Figure 8A:
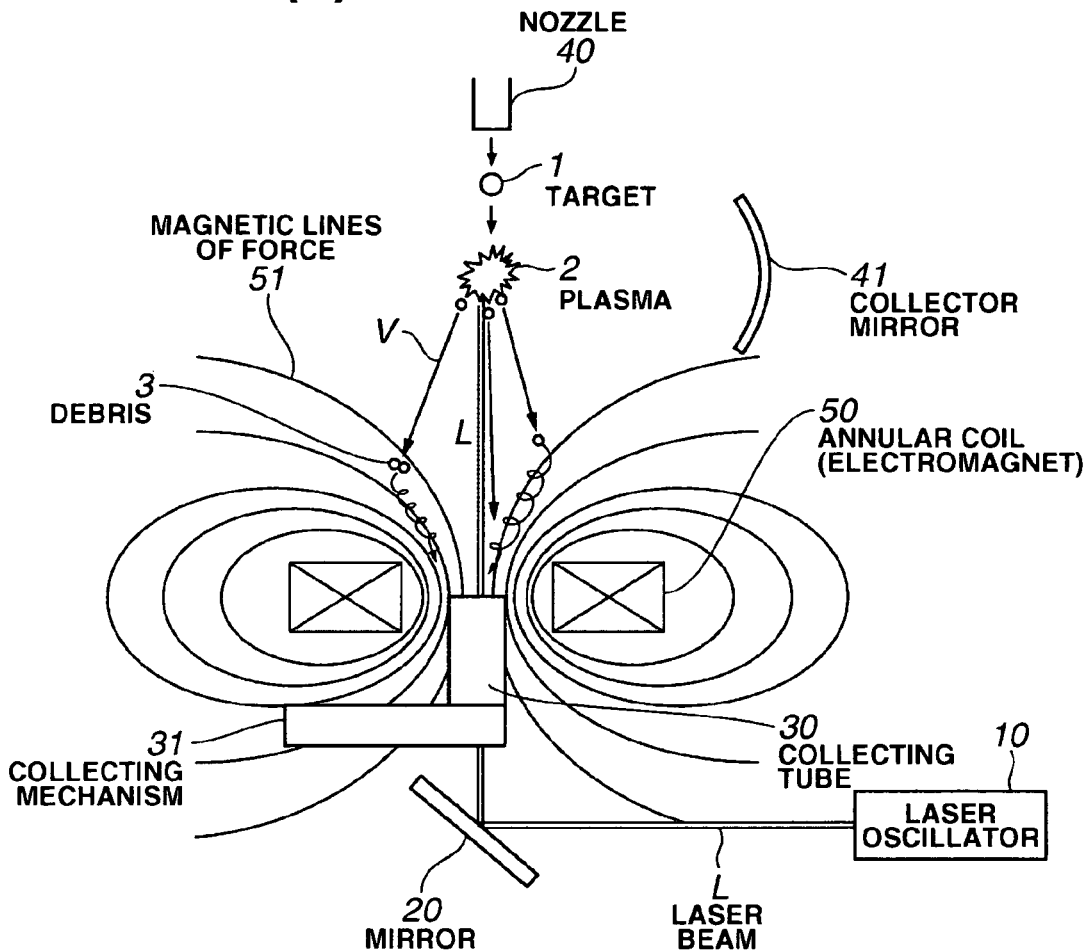
FIGS. 8(a) and (b) show an example of an arrangement according to a seventh embodiment of the invention.

FIG. 8(a) shows an arrangement according to the seventh embodiment. Here, a collecting tube 30, a mirror 20 and a laser oscillator 10 are disposed in much the same way as in FIG. 1(a). An annular coil 50 is situated in such a way that the collecting tube 30 is positioned on the center axis of the annular coil 50. A current is passed through the annular coil 50, making it function as a superconducting magnet, and magnetic lines of force 51 form around the direction of annular coil 50 energization. The magnetic lines of force 51 converge on a debris-collecting hole 32 in the collecting tube 30. Here, in order to have the magnetic lines of force 51 converge at the top end of the collecting tube 30, it is advantageous to position the top end of the collecting tube 30 so that it is offset slightly toward the nozzle 40 from the horizontal plane at the center of the annular coil 50.

When the laser beam L is irradiated at the target 1, debris 3 forms and the debris 3 spreads out downward in the diagram at a velocity v.

Figure 8B:
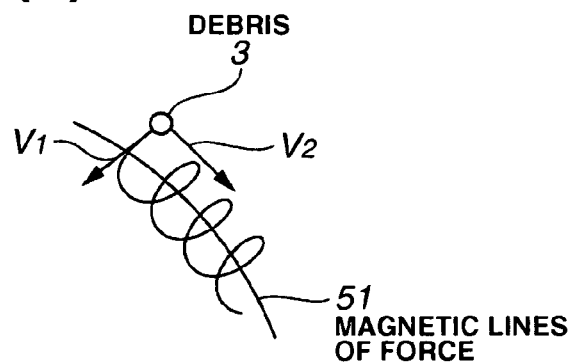

As shown in FIG. 8(b), the velocity v of the debris 3 is the sum of the component velocity v1 in a direction perpendicular to the magnetic lines of force 51 and the component velocity v2 in the direction horizontal to the magnetic lines of force 51. Lorentz forces determined by the charge, velocity v1 and the magnetic flux density act upon the debris 3 that is charged particles, causing the particles to be trapped by the magnetic lines of force 51. That is, the debris 3 moves at a parallel component velocity v2 in a direction parallel to the magnetic lines of force 51 while undergoing cyclotron motion at a radius corresponding to the perpendicular component velocity v1, and is thereby guided to the collecting tube 30.

Because this seventh embodiment has an arrangement (e) in which the debris 3 is trapped by magnetic lines of force 51 and is guided to a collecting tube 30, the debris 3 which would otherwise spread out and be difficult to collect can be reliably trapped by magnetic lines of force 51 and reliably guided to the collecting tube 30, enabling the collecting efficiency of the debris 3 to be increased.

Moreover, in this seventh embodiment, the collecting tube 30 is situated in the travel path of the target 1, in addition to which the direction of laser irradiation faces the direction of travel by the target 1. Hence, this embodiment has arrangements (a) and (b) similar to those of the first embodiment.

In this seventh embodiment, as shown in FIG. 8(a), because the laser beam L is output toward the oncoming target 1, the greatest amount of debris 3 forms on the side of the target 1 in the direction of travel; that is, the side of the irradiated face of the target 1.

This large amount of debris 3 that has formed spreads at a velocity v while maintaining momentum in the direction of travel by the target 1. The component velocity v2 of the debris 3 in a direction parallel to the magnetic lines of force 51 increases in accordance with the velocity of travel by the target 1. Because the debris 3 travels rapidly on the collecting tube 30 side along the magnetic lines of force 51 at a velocity v2 which corresponds to the velocity of travel by the target 1, the debris 3 is able to reach the collecting tube 30 before it spreads out over a wide area. Hence, the collecting efficiency of the debris 3 is further improved.

By combining arrangement (c) with the seventh embodiment, the debris collecting efficiency can be increased even further.

Figure 10A:
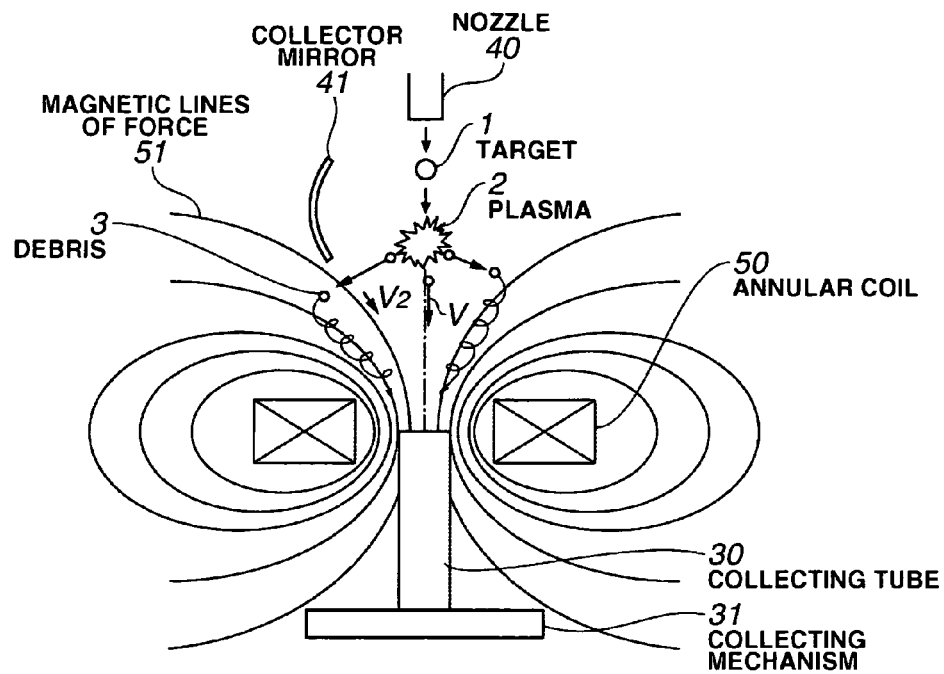
FIGS. 10(a) and (b) show views, in the seventh embodiment, which compare a case in which the target is not accelerated with a case in which the target is accelerated.
Figure 10B:
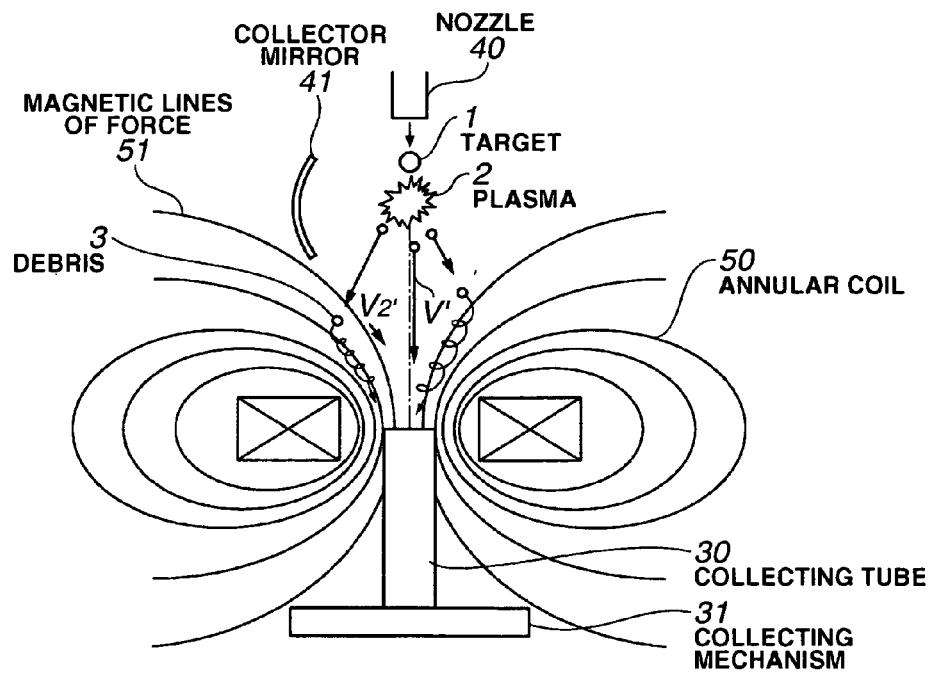

FIGS. 10(a) and (b) compare a case in which the target 1 is not accelerated (FIG. 10(a)) with a case in which the target 1 is accelerated using an accelerator (FIG. 10(b)).

By accelerating the target 1, the velocity of travel by the target 1 increases from an unaccelerated velocity V to a higher velocity V'. The component velocity of the debris 3 in the direction parallel to the magnetic lines of force 51 increases from v2 to v'2 in accordance with the change in velocity. Therefore, the time until the debris 3 reaches the collecting tube 30 can be shortened, the debris 3 can be collected by the collecting tube 30 before it spreads, and the collection efficiency of the debris 3 can be made even higher.

Moreover, the seventh embodiment, as in FIG. 3, may have an arrangement in which the laser beam L passes outside the collecting tube 30. This eliminates the need to form in the collecting tube 30 a space for allowing the passage of laser beam L (laser beam passage 33), making more space available for collecting debris (debris collecting orifice 32), and thus enabling a further increase in the collection efficiency of the debris 3.

In the seventh embodiment, the direction of laser irradiation faces the direction of travel by the target 1. However, the direction of laser irradiation may be set as desired and need not necessarily face the direction of travel by the target 1, provided there is a collecting tube 30 in the direction of travel by the target 1. For example, the laser beam L may be irradiated in a direction perpendicular to the direction of travel by the target 1.

The invention may also be worked as a combination of the seventh embodiment with the fourth embodiment shown in FIG. 5. By irradiating the target 1 with a plasma-generating laser beam L1 having a relatively low energy level, the amount of debris 3 that initially forms can be reduced, enabling the collection efficiency of the debris 3 to be further increased.

It is also possible for the invention to be worked as a combination of the seventh embodiment with the fifth embodiment shown in FIG. 6, or with the sixth embodiment shown in FIG. 7. Working the invention as a combination of the seventh embodiment with the sixth embodiment enables the initial amount of debris 3 generated to be reduced and enables the collecting efficiency of the debris 3 to be further increased, in addition to which it enables both laser beams L1 and L2 to be output with the same laser oscillator 10, thus making it possible to simplify the construction of the apparatus.

Because there is no need to form in the collecting tube 30 a space for the passage of the laser beam L, more space is available for collecting debris, thus making it possible to further increase the collection efficiency of the debris 3.

Figure 9:
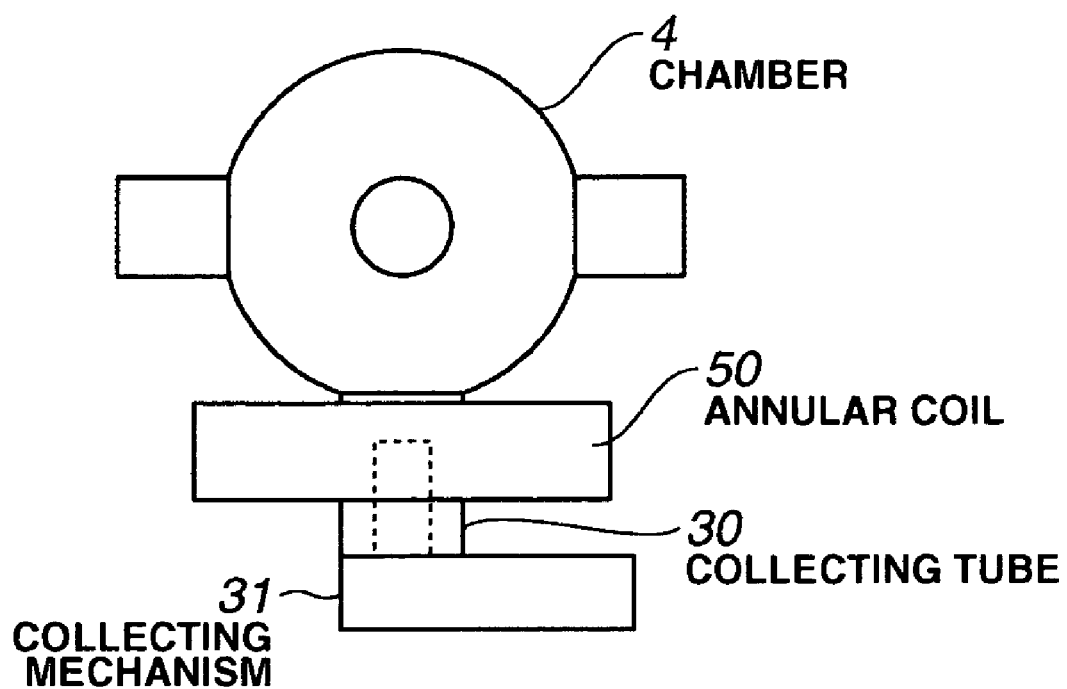
FIG. 9 shows an outside view of the apparatus in the seventh embodiment.

FIG. 9 is an outside view of the apparatus. This FIG. 9 shows an example of an arrangement in which an annular coil 50 is provided outside of the chamber 4, although the invention may be practiced instead using an annular coil 52 provided inside the chamber 4.

The invention claimed is:

1. A debris collector in an EUV light generator, which comprises a target feeder that feeds a target from a nozzle to a predetermined space, and which is adapted for use in an EUV light generator in which the target is irradiated with a laser beam from a laser beam irradiator so as to render the target into a plasma state and thereby generating EUV light, and which collects debris that arises in the course of plasma formation, wherein the debris collector that collects debris is disposed only at close proximity in a direction perpendicular to, of all faces on the target that is fed, a face irradiated by the laser beam.

2. The debris collector in an EUV light generator according to claim 1, comprising:

a plasma-generating laser beam irradiator that irradiates the target with plasma-generating laser beam of an energy level sufficient for converting the target into a plasma state; and a plasma-heating laser beam irradiator that irradiates the target with plasma-heating laser beam of an energy level sufficient for heating the target which is converted into a plasma state and generating EUV light, wherein the debris collector is disposed opposite to, of all faces on the target, a face that is irradiated with the plasma-generating laser beam.

3. The debris collector in an EUV light generator according to claim 1, comprising a laser beam irradiator that irradiates the target first with a plasma-generating laser beam of an energy level sufficient for converting the target into a plasma state, then with a plasma-heating laser beam of an energy level sufficient for heating the target which is converted into a plasma state and generating EUV light.

4. The debris collector in an EUV light generator according to claim 1, wherein the debris collector is a tube having a debris-holding space, the tube being formed therein a space through which the laser beam is allowed to pass.

5. The debris collector in an EUV light generator according to claim 1, wherein the debris collector is a tube having a debris-holding space, and an optical system is disposed so that the laser beam passes outside of the tube.

6. A debris collector in an EUV light generator, which is adapted for use in an EUV light generator in which a traveling target is irradiated with a laser beam from a laser beam irradiator to render the target into a plasma state and thereby generating EUV light, and which collects debris that arises in the course of plasma formation, wherein the laser beam irradiator is disposed such that direction of the laser beam irradiation faces travelling direction of the target, and the debris collector that collects debris is disposed in the traveling direction of the target.

7. The debris collector in an EUV light generator according to claim 6, comprising:

a plasma-generating laser beam irradiator that irradiates a target with plasma-generating laser beam of an energy level sufficient for converting the target into a plasma state; and a plasma-heating laser beam irradiator that irradiates the target with plasma-heating laser beam of an energy level sufficient for heating the target which is converted into a plasma state and generating EUV light, wherein the plasma-generating laser beam irradiator is disposed such that direction of plasma-generating laser beam irradiation faces traveling direction of the target.

8. The debris collector in an EUV light generator according to claim 6, comprising a laser beam irradiator that irradiates the target first with a plasma-generating laser beam of an energy level sufficient for converting the target into a plasma state, then with a plasma-heating laser beam of an energy level sufficient for heating the target which is converted into a plasma state and generating EUV light.

9. The debris collector in an EUV light generator according to claim 6, wherein the debris collector is a tube having a debris-holding space, the tube being formed therein a space through which the laser beam is allowed to pass.

10. The debris collector in an EUV light generator according to claim 6, wherein the debris collector is a tube having a debris-holding space, and an optical system is disposed so that the laser beam passes outside of the tube.

11. A debris collector in an EUV light generator, which is adapted for use in an EUV light generator in which a traveling target is irradiated with a laser beam from a laser beam irradiator so as to render the target into a plasma state and thereby generating EUV light, and which collects debris that arises in the course of plasma formation, wherein the debris includes charged particles, the debris collector that collects debris is disposed in traveling direction of the target, and a magnetic line generator that generates magnetic lines of force that guide the charged particles to the debris collector is provided.

12. The debris collector in an EUV light generator according to claim 11, wherein the laser beam irradiator is disposed such that direction of laser beam irradiation faces traveling direction of the target.

13. The debris collector in an BUY light generator according to claim 12, comprising:

a plasma-generating laser beam irradiator that irradiates the target with a plasma-generating laser beam of an energy level sufficient for converting the target into a plasma state; and a plasma-heating laser beam irradiator that irradiates the target with a plasma-heating laser beam of an energy level sufficient for heating the target which is converted into a plasma state and generating BUY light, wherein the plasma-generating laser beam irradiator is disposed such that the direction of plasma-generating laser beam irradiation faces the traveling direction of the target.

14. The debris collector in an BUY light generator according to claim 12, comprising a laser beam irradiator that irradiates the target first with a plasma-generating laser beam of an energy level sufficient for converting the target into a plasma state, then with a plasma-heating laser beam of an energy level sufficient for heating the target which is converted into a plasma state and generating EUV light.

15. The debris collector in an EUV light generator according to claim 12, wherein the debris collector is a tube having a debris-holding space, the tube being formed therein a space through which the laser beam is allowed to pass.

16. The debris collector in an EUV light generator according to claim 12, wherein the debris collector is a tube having a debris-holding space, and an optical system is disposed so that the laser beam passes outside of the tube.

* * * * *